US012276899B2

(12) United States Patent
Shimizu et al.

(10) Patent No.: US 12,276,899 B2
(45) Date of Patent: Apr. 15, 2025

(54) IMAGE PICKUP DEVICE AND METHOD OF TRACKING SUBJECT THEREOF

(71) Applicant: MAXELL, LTD., Kyoto (JP)

(72) Inventors: Hiroshi Shimizu, Kyoto (JP); Kazuhiko Yoshizawa, Kyoto (JP); Yasunobu Hashimoto, Kyoto (JP); Nobuo Masuoka, Kyoto (JP)

(73) Assignee: MAXELL, LTD., Kyoto (JP)

( * ) Notice: Subject to any disclaimer, the term of this patent is extended or adjusted under 35 U.S.C. 154(b) by 0 days.

(21) Appl. No.: 18/504,828

(22) Filed: Nov. 8, 2023

(65) Prior Publication Data

US 2024/0069412 A1 Feb. 29, 2024

Related U.S. Application Data

(63) Continuation of application No. 16/822,393, filed on Mar. 18, 2020, now Pat. No. 11,860,511, which is a (Continued)

(51) Int. Cl.
*G03B 13/36* (2021.01)
*G01S 3/00* (2006.01)
(Continued)

(52) U.S. Cl.
CPC ................ *G03B 13/36* (2013.01); *G01S 3/00* (2013.01); *G06V 10/40* (2022.01); *G06V 10/751* (2022.01);
(Continued)

(58) Field of Classification Search
CPC ........... H04N 5/232127; H04N 5/2258; H04N 5/23218; H04N 5/23238; H04N 5/23293;
(Continued)

(56) References Cited

U.S. PATENT DOCUMENTS 6,614,998 B1 * 9/2003 Senba .................. H04N 23/743 396/77
6,686,970 B1 2/2004 Windle
(Continued)

FOREIGN PATENT DOCUMENTS

JP H05-80248 A 4/1993
JP 11-234560 A 8/1999
(Continued)

OTHER PUBLICATIONS

Search Report issued in corresponding International Patent Application No. PCT/JP2014/070164, dated Sep. 2, 2014.
(Continued)

*Primary Examiner* — Christopher K Peterson
(74) *Attorney, Agent, or Firm* — Rimon P.C.

(57) ABSTRACT

The present invention provides an image pickup device that recognizes the object that the user is attempting to capture as the subject, tracks the movement of that subject, and can continue tracking the movement of the subject even when the subject leaves the capturing area so that the subject can always be reliably brought into focus. The image pickup device includes a main camera that captures the subject; an EVF that displays the captured image captured by the main camera, a sub-camera that captures the subject using a wider capturing region than the main camera, and a processing unit that extracts the subject from the captured images captured by the main camera and the sub-camera, tracks the extracted subject, and brings the subject into focus when an image of the subject is actually captured. When the subject moves outside of a capturing region of the main camera, the processing unit tracks the subject extracted from the captured image captured by the sub-camera.

20 Claims, 9 Drawing Sheets

Related U.S. Application Data continuation of application No. 15/500,286, filed as application No. PCT/JP2014/070164 on Jul. 31, 2014, now Pat. No. 10,609,273.

(51) Int. Cl.

| | |
|---|---|
| ***G06V 10/40*** | (2022.01) |
| ***G06V 10/75*** | (2022.01) |
| ***G06V 40/20*** | (2022.01) |
| ***H01L 21/00*** | (2006.01) |
| ***H01L 21/3213*** | (2006.01) |
| ***H01L 21/8234*** | (2006.01) |
| ***H01L 29/423*** | (2006.01) |
| ***H01L 29/66*** | (2006.01) |
| ***H01L 29/78*** | (2006.01) |
| ***H04N 5/262*** | (2006.01) |
| ***H04N 23/45*** | (2023.01) |
| ***H04N 23/61*** | (2023.01) |
| ***H04N 23/63*** | (2023.01) |
| ***H04N 23/67*** | (2023.01) |
| ***H04N 23/69*** | (2023.01) |
| ***H04N 23/698*** | (2023.01) |
| ***H04N 23/90*** | (2023.01) |

(52) U.S. Cl.

CPC .............. *G06V 40/20* (2022.01); *H01L 21/00* (2013.01); *H01L 21/32139* (2013.01); *H01L 21/823456* (2013.01); *H01L 29/42372* (2013.01); *H01L 29/42376* (2013.01); *H01L 29/4238* (2013.01); *H01L 29/42384* (2013.01); *H01L 29/66613* (2013.01); *H01L 29/66621* (2013.01); *H01L 29/66628* (2013.01); *H01L 29/7834* (2013.01); *H01L 29/7835* (2013.01); *H01L 29/7836* (2013.01); *H04N 5/2628* (2013.01); *H04N 23/45* (2023.01); *H04N 23/61* (2023.01); *H04N 23/63* (2023.01); *H04N 23/675* (2023.01); *H04N 23/69* (2023.01); *H04N 23/698* (2023.01); *H04N 23/90* (2023.01)

(58) Field of Classification Search

CPC .. H04N 5/23296; H04N 5/247; H04N 5/2628; G01S 3/00; G03B 13/36; G06V 10/40; G06V 10/751; G06V 40/20; H01L 21/00; H01L 29/78; H01L 21/28008; H01L 29/42356; H01L 29/42376; H01L 29/66477; H01L 29/66795; H01L 29/7856; H01L 29/404; H01L 29/4236; H01L 29/66621

See application file for complete search history.

(56) References Cited

U.S. PATENT DOCUMENTS

| | | | |
|---|---|---|---|
| 7,684,687 | B2 | 3/2010 | Furuya |
| 9,143,671 | B2 | 9/2015 | Nonaka |
| 9,288,451 | B2 | 3/2016 | Oya |
| 9,736,356 | B2 | 8/2017 | Nonaka |
| 2007/0024738 | A1 | 2/2007 | Kanai et al. |
| 2009/0015658 | A1 | 1/2009 | Enstad et al. |
| 2009/0245573 | A1 | 10/2009 | Saptharishi et al. |
| 2010/0066843 | A1 | 3/2010 | Muramatsu |
| 2012/0002958 | A1 | 1/2012 | Muukki |
| 2012/0019708 | A1 | 1/2012 | Morihisa et al. |
| 2012/0050587 | A1 | 3/2012 | Yamamoto |
| 2012/0300051 | A1 | 11/2012 | Daigo et al. |
| 2013/0050496 | A1 | 2/2013 | Jeong |
| 2013/0120641 | A1 | 5/2013 | Nagaoka |
| 2014/0333775 | A1 | 11/2014 | Naikal et al. |
| 2017/0094184 | A1 | 3/2017 | Gao et al. |

FOREIGN PATENT DOCUMENTS

| | | | |
|---|---|---|---|
| JP | 2007-041046 | A | 2/2007 |
| JP | 2007-129480 | A | 5/2007 |
| JP | 2008-035348 | A | 2/2008 |
| JP | 2008-136024 | A | 6/2008 |
| JP | 2009-265583 | A | 11/2009 |
| JP | 2010-533416 | A | 10/2010 |
| JP | 2011-091705 | A | 5/2011 |
| JP | 2012-027229 | A | 2/2012 |
| JP | 2012-049651 | A | 3/2012 |
| JP | 2012-147370 | A | 8/2012 |
| JP | 2013-013050 | A | 1/2013 |
| JP | 2013-127601 | A | 6/2013 |
| JP | 2014-033313 | A | 2/2014 |
| JP | 2014-050022 | A | 3/2014 |

OTHER PUBLICATIONS

Japanese Notice of Reasons for Refusal issued in corresponding Japanese Patent Application No. 2016-537666, dated Jul. 2, 2019, with English Translation.

Japanese Notice of Reasons for Refusal issued in corresponding Japanese Patent Application No. 2016-537666, dated Jan. 7, 2020, with English translation.

U.S. PTO Non-Final Office Action issued in related parent U.S. Appl. No. 16/822,393, mailed on May 9, 2022.

U.S. PTO Final Office Action issued in related parent U.S. Appl. No. 16/822,393, mailed on Jan. 23, 2023.

Japanese Office Action issued in corresponding Japanese Patent Application No. 2016-537666, dated Sep. 18, 2018, with English Translation.

U.S. PTO Non-Final Office Action issued in related parent U.S. Appl. No. 15/500,286, mailed on Aug. 27, 2018.

U.S. PTO Final Office Action issued in related parent U.S. Appl. No. 15/500,286, mailed on May 28, 2019.

U.S. PTO Notice of Allowance issued in related parent U.S. Appl. No. 15/500,286, mailed on Nov. 6, 2019.

Entire U.S. PTO (IFW) associated with related parent U.S. Appl. No. 15/500,286, filed Jan. 30, 2017.

* cited by examiner

IMAGE PICKUP DEVICE AND METHOD OF TRACKING SUBJECT THEREOF

CROSS REFERENCE TO RELATED APPLICATIONS

This application is a Continuation of U.S. patent application Ser. No. 16/822,393, filed on Mar. 18, 2020, which in turn is a Continuation of U.S. patent application Ser. No. 15/500,286 filed on Jan. 30, 2017, which is the U.S. National Phase under 35 U.S.C. § 371 of International Application No. PCT/JP2014/070164, filed on Jul. 31, 2014, the entire contents of each of which are hereby incorporated by reference.

TECHNICAL FIELD

The present invention relates to an image pickup device for capturing a subject, and more particularly to a technology for tracking the subject when autofocus is enabled.

BACKGROUND ART

In recent years, digital cameras that capture two-dimensional images by projecting an image of a subject through a lens onto a camera sensor that is a group of a large number of pixels made of a semiconductor material and then measuring the amount of light with which each pixel is exposed have become more common.

Moreover, in cameras, in order to project a focused image of the subject onto the camera sensor or the surface of film, the distance between the lens and the camera sensor is required to be adjusted such that the point light sources that is a group of self-emitting or reflected point light sources included in the image of the subject create blur spots of less than or equal to a prescribed diameter on the camera sensor or the film surface. However, most cameras have an autofocus feature that handles this process automatically according to the distance between the subject and the camera.

Furthermore, "blur spots of less than or equal to a prescribed diameter" refers to blur spots of a diameter less than or equal to the resolution of the human eye when the captured image is viewed from the distance of distinct vision, that is, when viewed from a distance at which the human eye can focus on and see the image clearly without having to focus in a particularly strenuous manner. When viewing most typically photographed images, diameters of approximately 1/1000 to 1/1500 of the diagonal of the image represent the limit of resolution of the human eye.

In order to autofocus, instead of performing a manual operation by the user to bring the desired subject within the screen into focus, the camera first needs to focus on the object positioned in the center of the screen as the user's intended subject within the screen, and the subject must always be brought into the center of the screen in this case. In other words, there are situations in which it is difficult to focus the image if the subject moves away from the center of the screen.

One example of a new autofocus technology for automatically focusing on a user's intended subject is the autofocus device disclosed in Japanese Unexamined Patent Application Publication No. H5-80248 (Patent Literature 1). In this autofocus device, the subject to be captured is identified within an area of focus, and the focal position of the identified subject is automatically detected to bring that subject into focus. The device includes a movement detection unit that calculates, on a per-frame basis, the entropy of images within each small area of a region of interest that is constituted by a plurality of such small areas and then detects changes in the entropy of each small area between frames in order to detect movement of the subject. This technology therefore allows the area of focus to be moved to track the movement of the subject in accordance with the detection results from the movement detection unit.

In Patent Literature 1, "entropy" is a value that quantifies randomness, and in the operation in Patent Literature, the entropy of the subject within the screen targeted in advance by the user is obtained as a value for identifying the subject by recognizing the randomness of the output data from the portion of the camera sensor onto which the subject to be captured is projected at the position on the camera sensor onto which the image of the subject is projected, and when the subject moves within the screen, the entropy of each screen location is calculated, whereby the optical image projected onto the region with the closest entropy to the original entropy of the subject is recognized as the subject, and then the focus is brought onto that subject.

Furthermore, the types of subjects that users typically capture images of are limited to some extent. One specific example of such a common subject is peoples' faces, and for this use case, there are already a variety of camera products on the market that can extract a person's face as the subject and focus on that subject automatically.

RELATED ART DOCUMENTS

Patent Documents

Patent Literature 1: Japanese Unexamined Patent Application Publication No. H5-80248

SUMMARY OF THE INVENTION

Problems to be Solved by the Invention

However, in conventional technologies, even when the object that the user is attempting to capture is correctly recognized as the subject and brought into focus, if that subject leaves the capturing area displayed on the camera's finder or the like, the subject cannot be tracked and can therefore no longer be brought into focus.

The present invention therefore aims to provide an image pickup device that recognizes the object that the user is attempting to capture as the subject, tracks the movement of that subject, and can continue tracking the movement of the subject even when the subject leaves the capturing area so that the subject can always be reliably brought into focus.

Means for Solving the Problems

A simple overview of representative examples of the invention as disclosed in the present application is provided below.

In other words, the present invention provides an image pickup device that captures a subject and obtains a captured image of the subject, including: a first camera sensor that captures the subject; a display unit that displays the captured image captured by the first camera sensor; a second camera sensor that captures the subject using a wider capturing region than the first camera sensor; and a processing unit that extracts the subject from captured images captured by the first camera sensor and the second camera sensor, tracks the subject that is extracted, and brings the subject into focus when an image of the subject is actually captured, wherein when the subject moves outside of a capturing region of the first camera sensor, the processing unit tracks the subject extracted from the captured image captured by the second camera sensor.

The present invention also provides an image pickup device that captures a subject and obtains a captured image of the subject, including: a camera sensor that captures a region wider than a capturing region of the captured image of the subject; a display unit that displays an image of the capturing region of the captured image of the subject; and a processing unit that extracts the subject from the captured image captured by the camera sensor, tracks the subject that is extracted, and brings the subject into focus when an image of the subject is actually captured, wherein when the subject moves outside of the capturing region, the processing unit tracks the subject extracted from a region outside the capturing region within the captured image captured by the camera sensor.

Moreover, the present invention provides a method of tracking a subject for use in an image pickup device that captures the subject and obtains a captured image of the subject. The method includes the steps of extracting the subject from captured images captured by a first camera sensor and a second camera sensor that captures the subject using a wider capturing region than the first camera sensor, tracking the subject that is extracted, and bringing the subject into focus when an image of the subject is actually captured. The steps are performed by a processing unit. When the subject moves outside of a capturing region of the first camera sensor, the subject extracted from the captured image captured by the second camera sensor is tracked.

Furthermore, the present invention provides a method of tracking a subject for use in an image pickup device that captures the subject and obtains a captured image of the subject. The method includes the steps of extracting the subject from a captured image captured by a camera sensor that captures a region wider than a capturing region of the captured image of the subject, tracking the subject that is extracted, and bringing the subject into focus when an image of the subject is actually captured. The steps are performed by a processing unit. When the subject moves outside of the capturing region, the subject extracted from a region outside the capturing region within the captured image captured by the camera sensor is tracked.

Effects of the Invention

The present invention makes it possible to recognize a subject and track that subject even when the subject is birds that are flying at high speed, for example. Therefore, the subject continues to be recognized as the subject and is not lost even after leaving the capturing area displayed on the camera's finder or the like, thereby making it possible to continue capturing the subject as well as to continue bringing the subject into the optimal focus.

BRIEF DESCRIPTIONS OF THE DRAWINGS

Figures 4A, 4B, 4C:
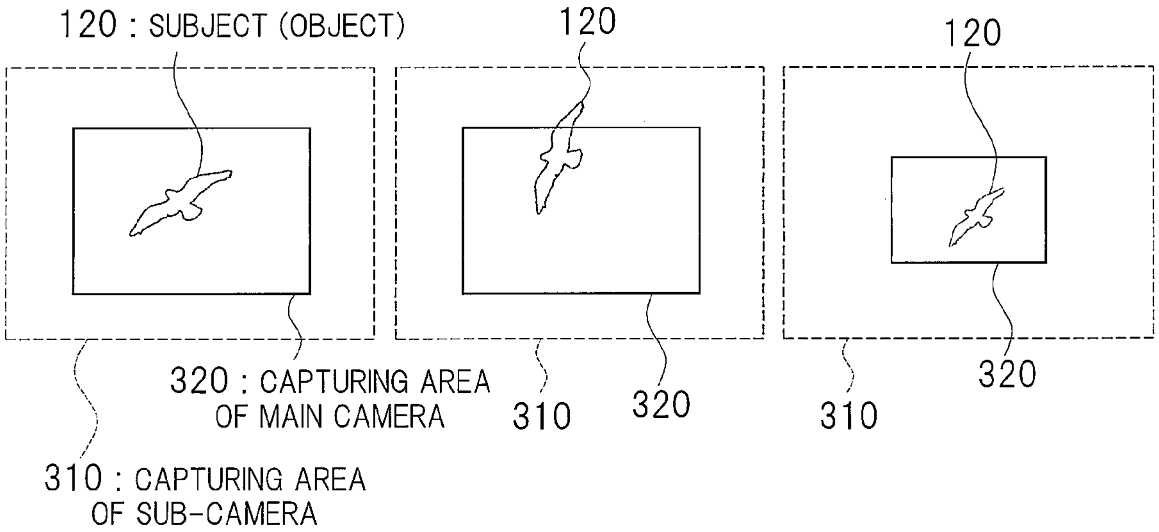

FIGS. 4(A) to 4(C) are explanatory drawings for explaining the capturing areas of a main camera and a sub-camera of the image pickup device according to Embodiment 1 of the present invention.

FIGS. 5(A) to 5(D) are explanatory drawings for explaining examples of images displayed in an EVF of the image pickup device according to Embodiment 1 of the present invention.

Figure 6:
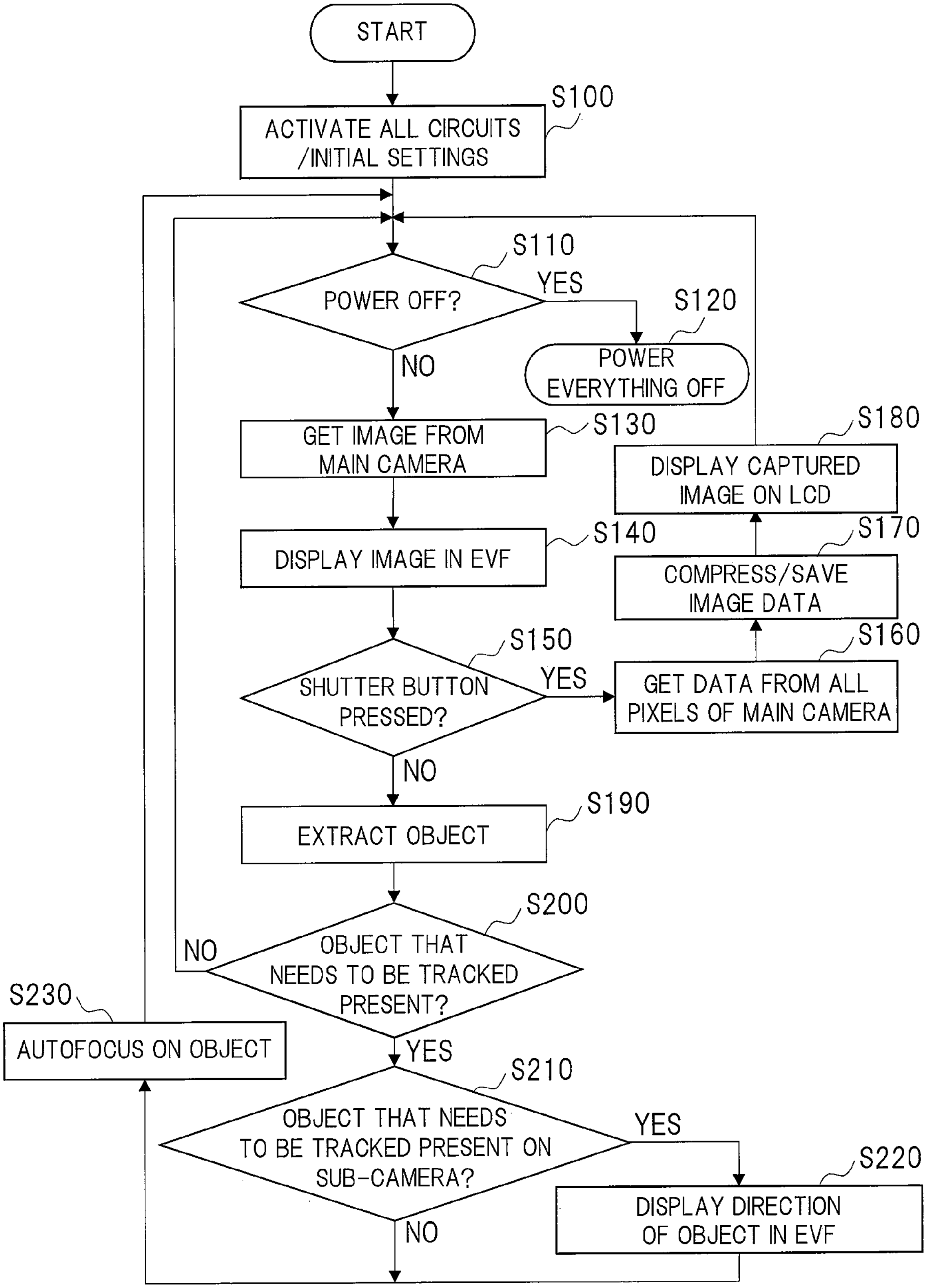

FIG. 6 is a flowchart illustrating the operation of the image pickup device according to Embodiment 1 of the present invention.

Figure 7:
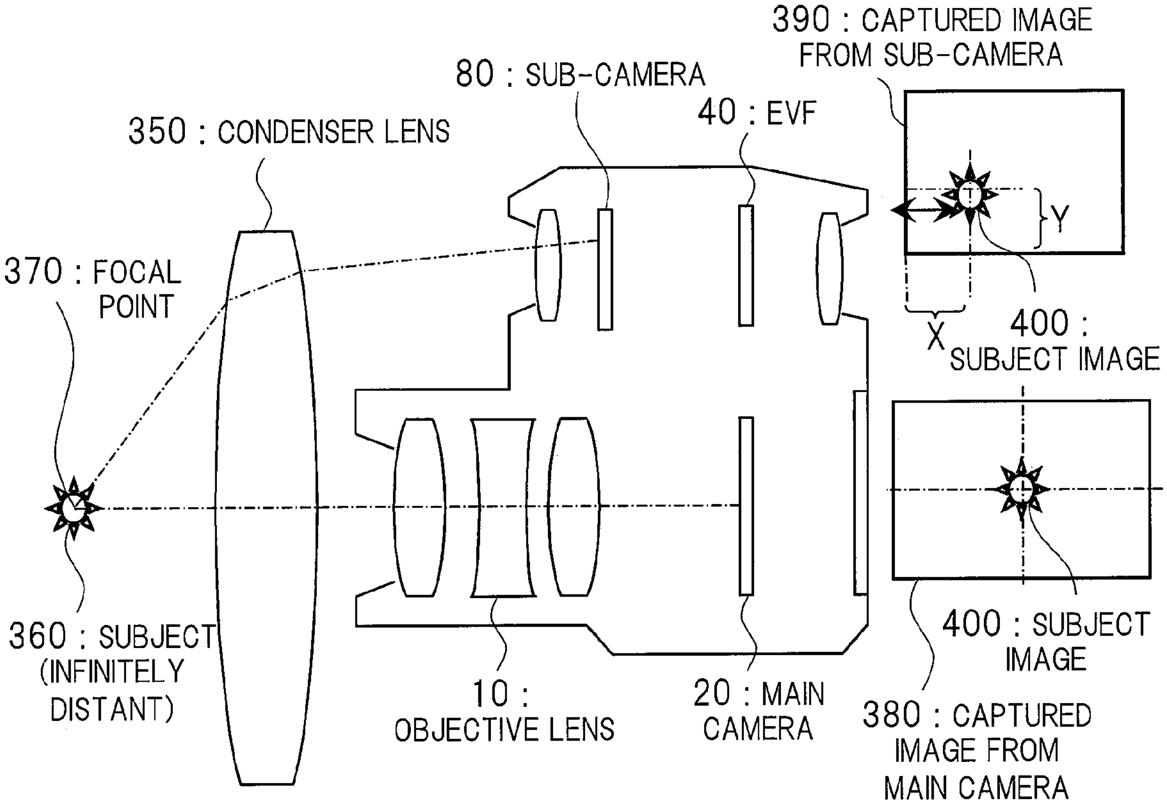

FIG. 7 is an explanatory drawing for explaining a method of correcting for mounting error in the sub-camera of the image pickup device according to Embodiment 1 of the present invention.

Figure 8:
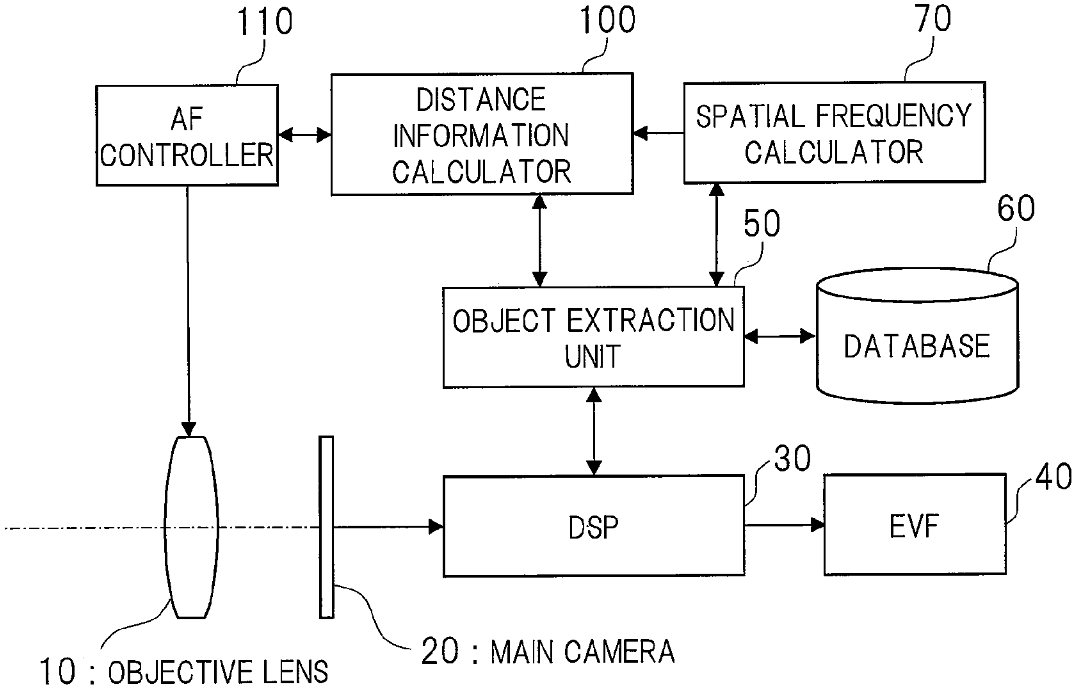

FIG. 8 is a block diagram illustrating a basic configuration of an image pickup device according to Embodiment 2 of the present invention.

Figure 9A:
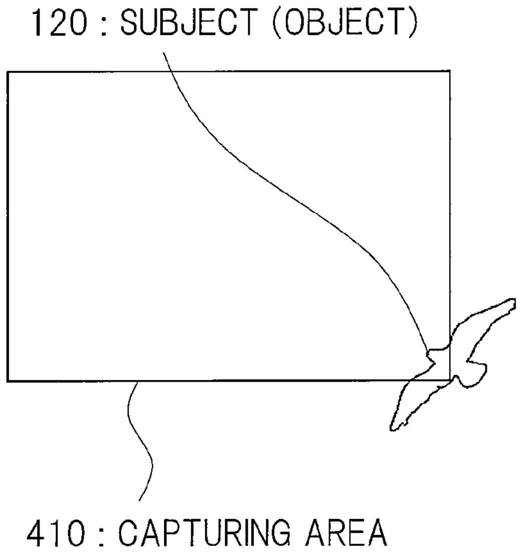
Figure 9B:
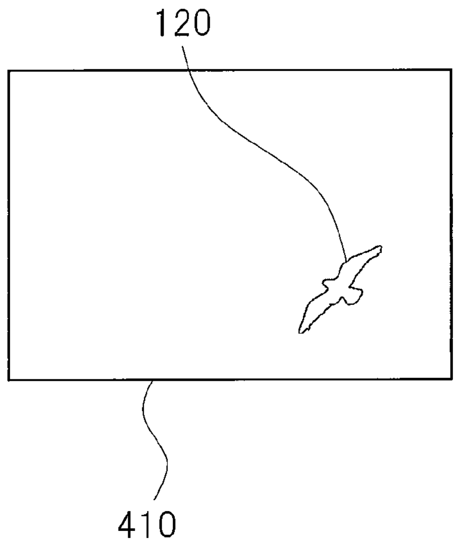

FIGS. 9(A) and 9(B) are explanatory drawings for explaining a subject-tracking operation of the image pickup device according to Embodiment 2 of the present invention.

Figure 10A:
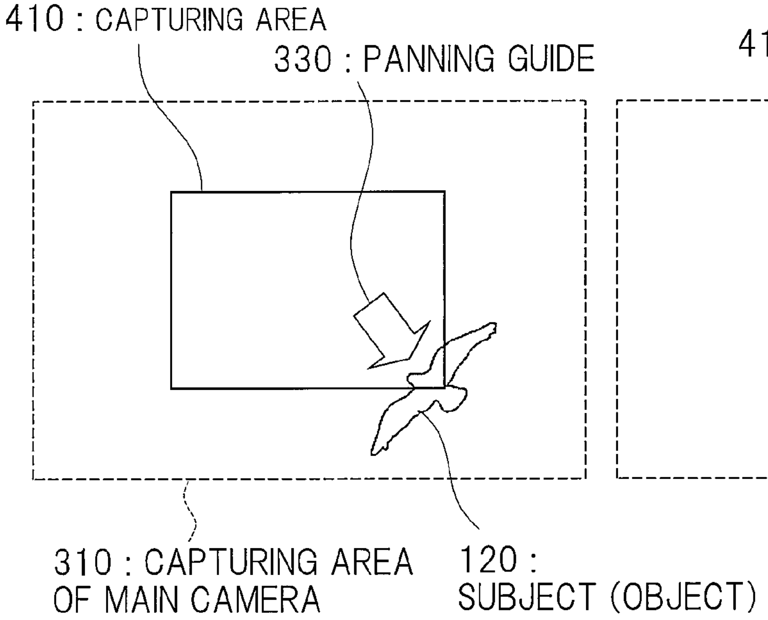
Figure 10B:
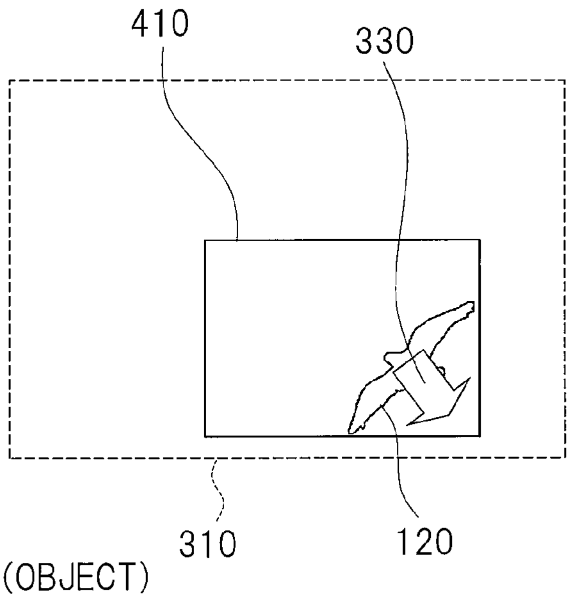

FIGS. 10(A) and 10(B) are explanatory drawings for explaining the subject-tracking operation of the image pickup device according to Embodiment 2 of the present invention.

Figure 11A:
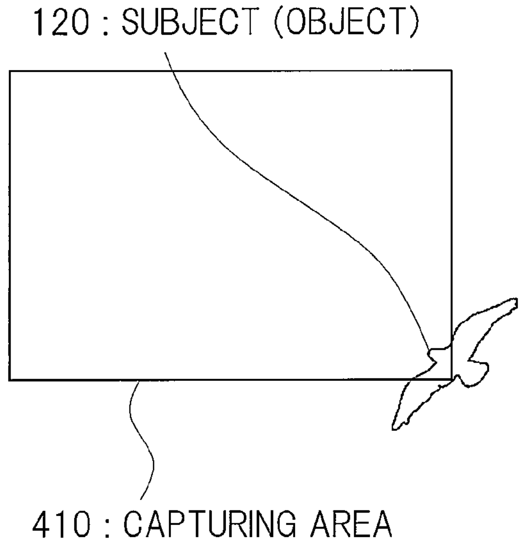
Figure 11B:
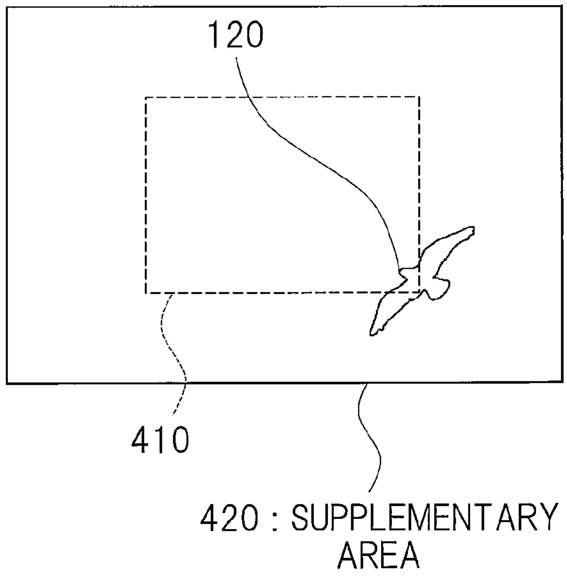

FIGS. 11(A) and 11(B) are explanatory drawings for explaining examples of images displayed in an EVF of an image pickup device according to Embodiment 3 of the present invention.

DETAILED DESCRIPTION OF PREFERRED EMBODIMENTS

Embodiments of the present invention will be described in detail below with reference to figures. Note that in the figures for describing these embodiments, inmost cases the same reference characters are used for components that are the same, and redundant descriptions of such components will be omitted.

Embodiment 1

<Basic Configuration of Image Pickup Device>

Figure 1:
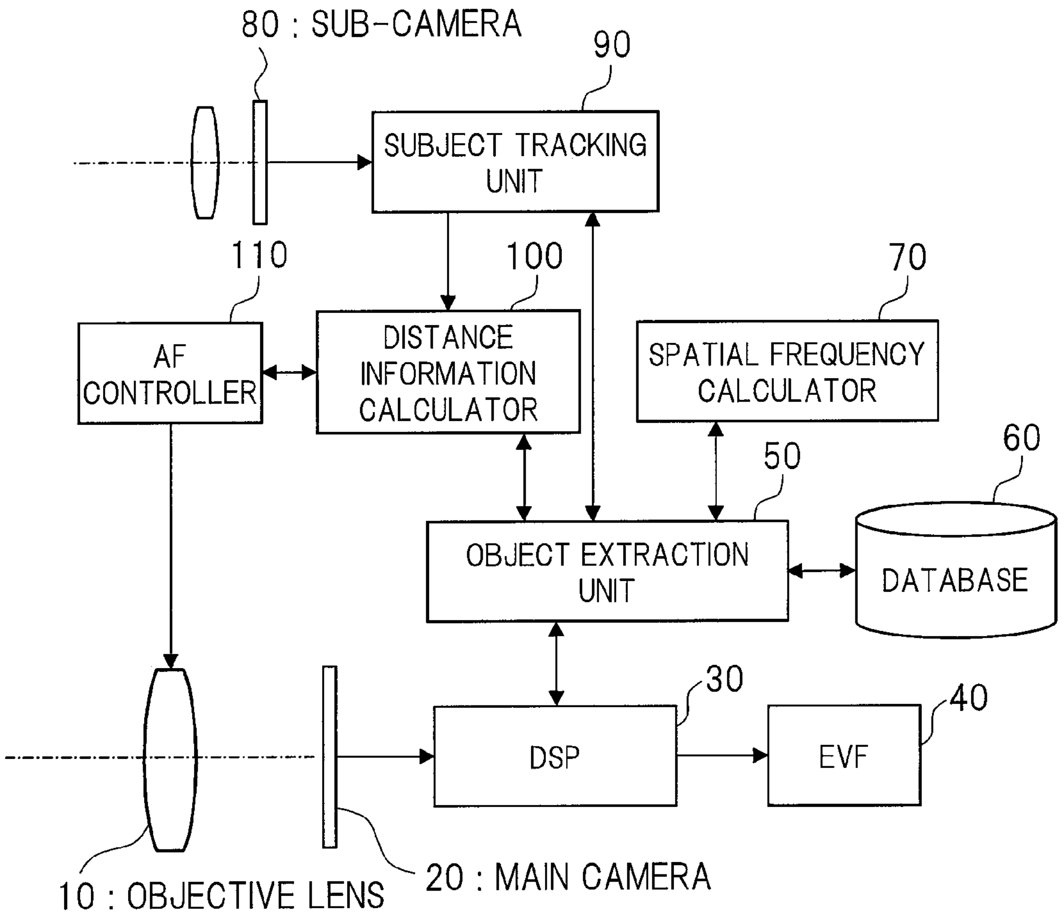
FIG. 1 is a block diagram illustrating a basic configuration of an image pickup device according to Embodiment 1 of the present invention.

Next, the basic configuration of an image pickup device according to Embodiment 1 of the present invention will be described with reference to FIG. 1. FIG. 1 is a block diagram illustrating the basic configuration of the image pickup device according to Embodiment 1 of the present invention.

As illustrated in FIG. 1, the image pickup device includes a main camera 20 serving as a first camera sensor onto which an image of a subject is projected via an objective lens 10, a digital signal processor (DSP) 30 that processes the output signal from the main camera 20, an electronic view finder (EVF) 40 serving as a display unit that displays an image of a capturing area that represents the region around the subject that will be captured, an object extraction unit 50 that extracts the object to use as the subject, a database 60 that stores information for recognizing objects, a spatial frequency calculator 70 that calculates focusing conditions for bringing the subject into focus, a sub-camera 80 serving as a second camera sensor and constituted by a camera sensor or the like that captures the same subject as the main camera 20 but does so at a wider angle than the main camera 20, a subject tracking unit 90 that tracks the subject, a distance information calculator 100 that calculates information about the distance to the subject, and an autofocus (AF) controller 110 that uses a motor to increase and decrease the relative distance between the objective lens 10 and the main camera 20 in accordance with the distance information calculated by the distance information calculator 100 in order to keep the subject in focus.

Together, the DSP 30, the object extraction unit 50, the spatial frequency calculator 70, the subject tracking unit 90, the distance information calculator 100, and the AF controller 110 form a processing unit.

<Operation of Image Pickup Device>

Next, the operation of the image pickup device according to Embodiment 1 of the present invention will be described with reference to FIG. 1.

First, an image of the subject that is projected via the objective lens 10 onto the main camera 20 is converted to an electronic signal and input to the DSP 30. Here, the input signal is converted to a YUV signal that includes brightness and color difference signals and simultaneously presented to the user in the EVF 40 so that the user can pan the image pickup device to track the subject, particularly when the subject is moving.

The output signal from the DSP 30 is also input to the object extraction unit 50. The object extraction unit 50 extracts a plurality of subjects contained in the image represented by the input signal. For a person's face, for example, the object extraction unit 50 checks for eyes/nose/mouth, or face outline for profile shots in order to extract the person's face such that the same subject can continue to be recognized even if the point of view changes due to changes in the relationship between the orientations of the subject and the camera. For peoples' faces, various other characteristics such as skin color and hair color, for example, can also be taken into account when the subject is identified.

Information needed to continue recognizing the same subject even when the orientation from which the subject is viewed changes, such as the constituent elements, shapes, and colors of subjects that are commonly captured by users, is stored in the database 60 in advance.

For people, for example, the data stored in the database 60 includes data elements such as the shapes and colors that are characteristic of situations such as walking, running, or sitting. Moreover, for birds, for example, the data includes data elements such as the characteristic shapes and colors of little birds, birds of prey, or differences in flight characteristics such as the tendency to extend or bend the neck of birds with long necks such as herons or swans.

For animals such as dogs, cats, or other animals, for example, the data includes data elements such as the characteristic shapes and colors of each animal. For automobiles such as sedans, sports cars, wagons, trucks, and racing cars, for example, the data includes data elements such as the characteristic shapes and colors of each type of automobile. For trains such as electric trains, steam trains, and other types of trains, for example, the data includes data elements such as the characteristic shapes and colors of each type of train.

The data stored in the database 60 is supplied to the object extraction unit 50. The data includes information that makes it possible to continue tracking subjects even if the orientations of those subjects change while those subjects are tracked by the image pickup device, particularly when those subjects are moving at high speed.

Here, the color and shape data is used in an algorithm that can recognize subjects from their overall shapes and color mixtures even when the focus shifts away from the subject and the image becomes slightly blurry to some extent.

In the captured image that is captured by the image pickup device, there may be several subjects that are initially present in the capturing area when the capturing process starts but later leave the capturing area during the capturing process or several subjects that only enter the capturing area after the capturing process starts and then continue to remain in the capturing area. However, these subjects can be tracked for a prescribed period of time, and then the subjects that always remain in the capturing area can be recognized as the actual subjects, that is, the objects that the user wants to capture, for example.

Here, the subject that remains positioned in the approximate center of the main camera 20 for the longest period of time can be given a heavier recognition weight as the object that the user actually wants to capture among the several subjects that may be present. This process and determination is handled by the object extraction unit 50.

The subject tracking unit 90 is also notified of the object that is recognized as the subject so that the same subject can also be tracked in the captured image that is captured by the sub-camera 80.

Furthermore, the portion of the information needed to calculate the distance to the subject is sent to the distance information calculator 100, and the subject captured by the sub-camera 80 is continued to be tracked even if that subject temporarily leaves the frame of the capturing area of the main camera so that information that indicates the position of that subject can continue to be sent to the object extraction unit 50.

Moreover, in order to focus on the subject that the object extraction unit 50 has recognized as the subject to capture that has been tracked by the user, the spatial frequency calculator 70 calculates the focusing conditions for bringing that subject into focus and sends those results to the distance information calculator 100 via the object extraction unit 50. The distance information calculator 100 then uses this information to send instructions to the AF controller 110 that can move the position of the objective lens 10, and the AF controller 110 uses a motor to increase or decrease the relative distance between the objective lens 10 and the main camera 20 in order to bring the subject into focus.

The spatial frequency calculator 70 then calculates a new and different spatial frequency on the basis of the newly obtained image, and this information is fed back into the AF controller 110 again using the same method as above, thereby making it possible to continuously keep the subject in focus.

Here, while the subject is tracked, the sensitivity of the sensor is increased and the aperture is closed to achieve a suitable depth of field in order to broaden the area of the image that is in focus without having to move the lens. Then, when the image pickup device actually captures an image, the shutter speed is increased and the sensitivity of the sensor is decreased as much as possible in order to achieve a more suitable S/N ratio. In this case, since the aperture is opened and the depth of field is reduced, the AF controller 110 is used to reliably bring the subject into focus before actually activating the shutter and then the captured image is taken out from the main camera 20. In this manner, it is possible to obtain a static image with good image quality, little camera shake, and an appropriately in-focus subject, particularly for moving subjects.

When the image is captured, the objective lens 10 does not necessarily need to be continuously moved in a complex manner in order to keep the subject perfectly in focus at all times while the subject is tracked. Instead, once the subject is brought into focus to some extent, the subject can be tracked in that state without moving the objective lens 10. For example, when the user presses the shutter button in order to capture an image of the subject, a final and more accurate focusing operation may be performed to capture the image. In this case, the objective lens 10 does not need to be moved in a complicated manner, thereby making it possible to reduce depletion of the battery that powers the image pickup device.

Furthermore, once an object has been recognized as the subject and is being tracked, an icon that indicates that the subject has been recognized can be superimposed as an overlay on the subject in the image feed from the main camera 20 that is displayed in the EVF 40. This makes it possible for the user to confirm that the subject has been recognized correctly.

If the wrong object is recognized as the subject, a button or the like (not illustrated in the figures) on the body of the image pickup device can be pressed to reset the tracking or tracking can be continued after changing the orientation of the image pickup device, for example, in order to make it possible to re-acquire the subject that the user is attempting to capture as the object to be tracked.

Alternatively, the subject to be tracked may be re-selected using a scheme in which the subject is tracked while the user is partially pressing the shutter button, an image is captured when the shutter button is fully pressed, and the subject is either not tracked or tracking is reset when the shutter button is not being pressed at all, for example. This scheme is effective in situations in which the user is attempting to capture images of subjects that move at high speeds and does not have time to temporarily remove his/her eyes from the EVF 40 to select the subject by tapping on another display unit (not illustrated in the figure), for example.

Furthermore, the sub-camera 80 captures image at a wider angle than the main camera 20. This makes it possible to continue tracking the subject in the image feed from the sub-camera 80 even when the subject leaves the capturing area captured by the main camera 20. Moreover, displaying a panning guide in the EVF 40 that indicates the direction in which the subject has left the capturing area makes it possible for the user to see that direction in which the subject has left the capturing area.

<Configuration of Digital Camera (Example of Image Pickup Device)>

Figure 2:
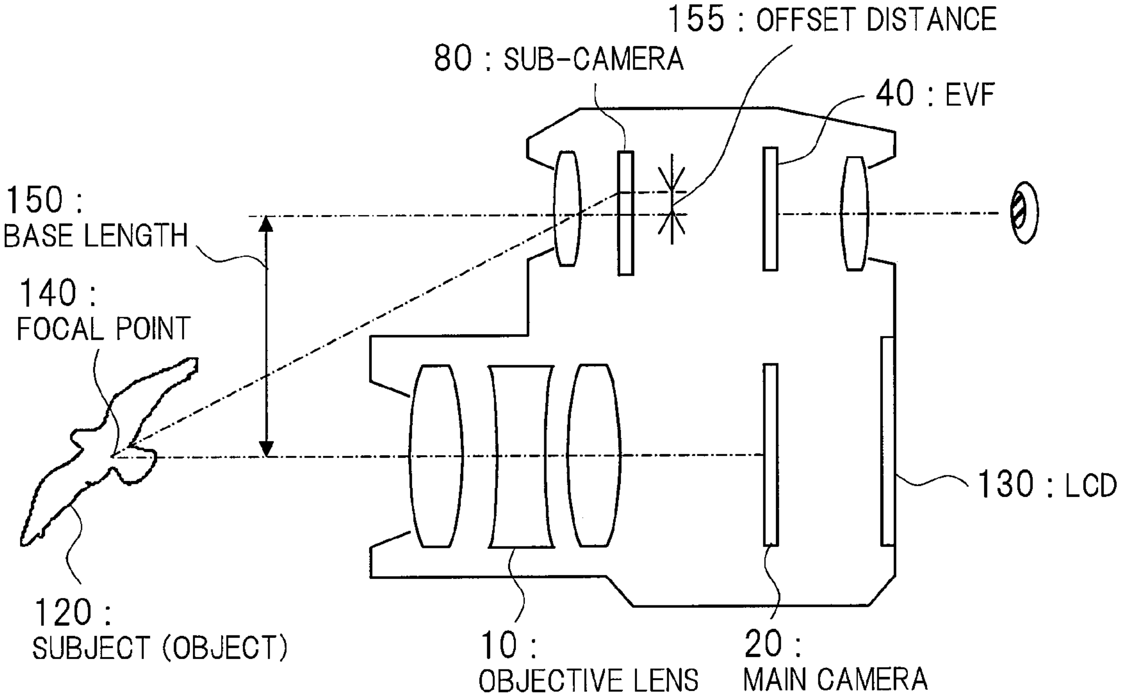
FIG. 2 illustrates a configuration of a digital camera that is an example of the image pickup device according to Embodiment 1 of the present invention.

Next, the configuration of a digital camera that is an example of the image pickup device according to Embodiment 1 of the present invention will be described with reference to FIG. 2. FIG. 2 illustrates the configuration of the digital camera that is an example of the image pickup device according to Embodiment 1 of the present invention.

As illustrated in FIG. 2, the digital camera projects an image of a subject 120 onto the main camera 20 via objective lenses 10 arranged in a triplet configuration and then captures images of the subject 120. The sub-camera 80 arranged in the upper portion of the digital camera also captures images of the subject 120. A captured image feed of the subject is displayed in the EVF 40 to allow the user to confirm which objects are being captured. The image feed is also displayed on a liquid crystal display (LCD) 130, where the subject can also be confirmed and various operations or the like can be performed.

As illustrated in FIG. 2, the digital camera selects a moving object such as a bird that is flying at high speed as the subject 120 (the object to be captured). This object is recognized and selected as the subject when the light in the image of the subject 120 passes through the triplet objective lens 10 and is received by the main camera 20 for at least a prescribed period of time and continues to be received for that prescribed period of time, for example.

Here, the user looks at the image feed of the subject that is being captured by the main camera 20 and that is displayed in the EVF 40 while changing the direction of the digital camera so as to track the subject 120 and keep the captured image of that subject on the main camera 20.

Then, at an appropriate time, the user presses the shutter button (not illustrated in the figure). This causes the objective lenses 10 to move so as to bring the subject 120 into focus, and then the main camera 20 captures an image of the subject, displays that image on the LCD 130 for several seconds, and saves the captured image to external memory (described later).

The digital camera also includes the sub-camera 80. The optical system of the sub-camera 80 is arranged in the same direction as and is substantially parallel to the optical system constituted by the objective lenses and the main camera 20. The optical system of the sub-camera 80 also has a wide angle of view that makes it possible to capture images at a wider angle than the optical system of the main camera 20. Once the subject 120 is recognized by the main camera 20 as the object to be captured, the sub-camera 80 also begins and continues to track that subject.

The image captured by the sub-camera 80 is used to track the subject 120. In addition, the focal point 140 of the subject 120 and the base length 1050, that is, the distance between the optical axes of the main camera 20 and the sub-camera 80, can be used in a triangulation algorithm for measuring the distance between the subject 120 and the digital camera. More specifically, when the coordinates of the subject 120 as projected onto the sub-camera 80 are shifted away from the center axis of the optical system of the sub-camera 80 by an offset distance 155, this distance can be used together with the dimensions of the optical system to estimate the position of the sub-camera 80, that is, the distance between the subject 120 and the position of the camera. This information can therefore be used as information for focusing the main camera 20 as well.

One method for recognizing the subject 120 as the object to be captured is the method described above in which the subject 120 is recognized after remaining present in the image feed from the main camera 20 for a prescribed period of time. In another method, the image feed captured by the main camera 20 and displayed in the EVF 40 may also be displayed in real time on the LCD 130 as a video, and then the user may use a finger or the like to tap the subject within that video on a touch panel (not illustrated in the figure) arranged on the LCD 130 in order to identify the subject 120 as the object to be captured.

In this case, the user would typically temporarily remove his/her eyes from the EVF 40, look at the LCD 130 and tap the subject, and then return to looking at the object to be captured in the EVF 40. Here, the sub-camera 80 includes the optical system with a wider angle than the optical system of the main camera 20 and continues to track the subject 120 even if the subject 120 leaves the capturing area of the main camera 20 when user removes his/her eyes from the LCD 130 and looks back into the EVF 40. Therefore, the position of the subject 120 can be indicated within the EVF 40, thereby making it possible to bring the subject 120 back into the EVF 40 and to continue tracking the subject 120 (a moving object).

<Internal Configuration of Digital Camera>

Figure 3:
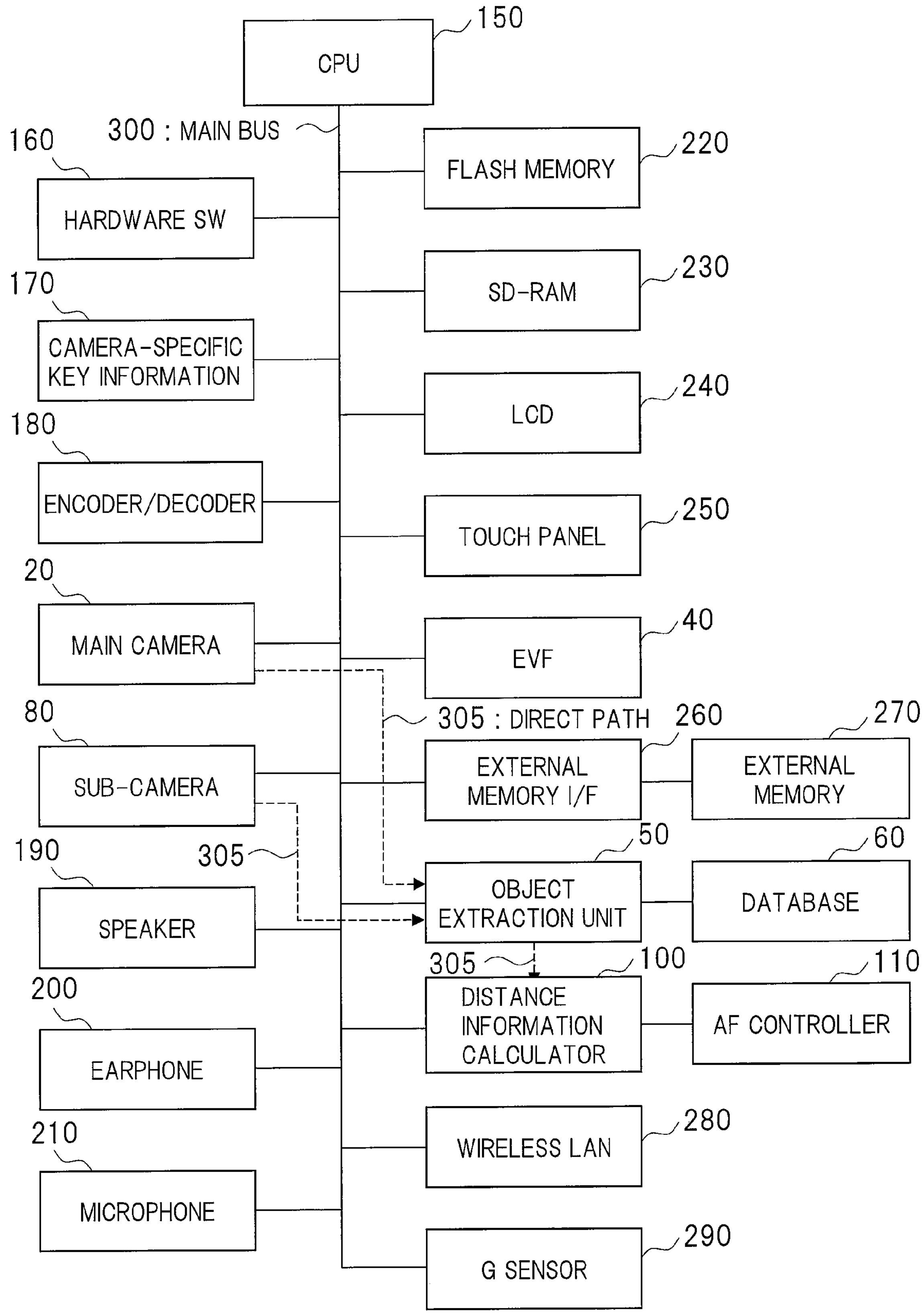
FIG. 3 is a block diagram illustrating an internal configuration of the digital camera that is an example of the image pickup device according to Embodiment 1 of the present invention.

Next, the internal configuration of the digital camera that is an example of the image pickup device according to Embodiment 1 of the present invention will be described with reference to FIG. 3. FIG. 3 is a block diagram illustrating an internal configuration of the digital camera that is an example of the image pickup device according to Embodiment 1 of the present invention.

As illustrated in FIG. 3, the digital camera is a computer system configured around a CPU 150 as the core. The CPU 150 and various peripheral circuits are connected together via a main bus 300.

A hardware switch (SW) 160 is a group of switches that includes the shutter button and various other switches for performing operations such as adjusting a zoom lens. When one of these switches is pressed, a code corresponding to that switch is sent along with a code indicating that the switch was pressed to the CPU 150, and the CPU 150 executes a process corresponding to that switch.

Programs for executing these processes are stored in a flash memory 220, and a working area for executing these processes is allocated in an SD-RAM 230. Camera-specific key information 170 is a number that identifies the individual digital camera or information based on a user's name that was registered to the digital camera by the user. The name of the digital camera or the user that captured an image is then embedded in the image data of captured images, and in some cases, this key information can be used to encrypt and protect the captured image data so that the captured images cannot be viewed by another user.

An encoder/decoder 180 is a circuit for compressing and decompressing the captured image data. The encoder/decoder 180 performs a JPEG compression process, for example, on the captured images from the main camera 20 and can also store those captured images in an external memory 270 such as an SD memory card, via an external memory interface 260. The encoder/decoder 180 can also decompress the images (such as static images and video) stored in the external memory 270 in order to display those images on an LCD 240.

The main camera 20 is a camera for capturing images of the subject 120. The main camera 20 is used both to track and capture images of the moving subject 120. The sub-camera 80 is a camera for tracking the subject and also includes a signal processing circuit.

Note that the DSP 30 in FIG. 1 that processes the signals from the main camera 20 is not illustrated in FIG. 3. However, the processes executed by the DSP 30 may be implemented within the main camera 20, for example. The subject tracking unit 90 to which the output signal from the sub-camera 80 is input is not illustrated in FIG. 3 either. However, the process executed by the subject tracking unit 90 may be implemented by the object extraction unit 50, or the process executed by the subject tracking unit 90 may be implemented as a process executed by the CPU 150, for example.

A speaker 190 plays back audio when a video recorded by the digital camera is played back and also emits sounds when the hardware SW 160 is pressed or a touch panel 250 arranged on the LCD 240 (described later) is tapped and when information such as notifications or warnings needs to be presented to the user.

When the digital camera is used to record video, an earphone 200 is used to monitor the audio data picked up by a microphone 210 while the video is recorded. Moreover, the earphone 200 can be used to play audio when previously recorded video is played back in order to check the recording results quietly without playing audio via the speaker 190, thereby allowing the user to check both the image data and audio data contained in the recorded video.

The LCD 240 can display images such as static images and videos that have been captured and saved. When the user inputs settings to the camera via the touch panel 250, the LCD 240 can also display setting items at the coordinates within the touch panel 250 to be tapped, and the user can then tap those coordinates to perform various operations on the digital camera.

The EVF 40 is used as the digital camera's finder when images are captured. The image displayed in the EVF 40 includes information such as the sensor sensitivity required to capture an image, the shutter speed, the aperture value, and the movement direction of the subject that is being tracked, and this information is displayed as an overlay on the real-time video feed from the main camera 20.

The external memory interface 260 is an interface into which the external memory 270 for saving the captured image data, such as a removable SD memory card, can be inserted/removed.

As illustrated in FIG. 1, the object extraction unit 50 has a feature for extracting and identifying the subject that the user is attempting to capture from within the images projected on the main camera 20 and the sub-camera 80. Characteristics such as the shape and color of the subject that should be identified as the object to be captured are stored in advance in the database 60, and the user can also add new characteristics.

The object extraction unit 50 first uses a G sensor 290 to determine whether the position and orientation of the digital camera are currently fixed or whether the user is currently changing the orientation of the digital camera to track a moving subject. If the camera is currently fixed, the object extraction unit 50 reads the characteristics for subjects 120 that exhibit relatively little movement, such as the faces of people or cats, from the database 60 in order to identify and determine the subject.

Moreover, if the orientation of the digital camera is currently changing, the object extraction unit 50 determines that the subject 120 is moving and therefore reads characteristics such as the shapes of flying birds, running animals, children, or cats or dogs as viewed from the side from the database 60 in order to identify and determine the subject 120.

For more unique subjects 120 that are not included in the database 60, if the orientation of the digital camera is currently being changed to track the subject, an image feed is displayed on the LCD 240, and the user can tap the touch panel 250 to identify the subject 120 and add the characteristics of that subject 120 to the database 60.

Moreover, when playing back video that was previously recorded, the user can tap the touch panel 250 while the video is playing or when the video is stopped with a PAUSE button in order to identify the subject 120 and add and store the characteristics of that subject to the database 60.

Here, although the information from the main camera 20 and the sub-camera 80 may be sent to the object extraction unit 50 via the main bus 300, the large amount of data constituted by the captured images can potentially occupy the main bus 300 that is managed directly by the CPU 150, and therefore the captured image data is sent via direct paths 305. As a result, the captured image data is sent directly to the object extraction unit 50 without putting any load on the main bus 300. This allows the CPU 150 to have enough bandwidth to handle the overall operation of the camera including the various camera operations, thereby making it possible to capture images without experiencing problems such as delays when other digital camera operations are performed.

The distance information calculator 100 and the AF controller 110 operate the same as those in FIG. 1. Information from the object extraction unit 50 is sent to the distance information calculator 100 via a direct path 305 as well, thereby making it possible to further reduce the load on the main bus 300 as well as execute tracking and autofocusing processes without affecting the normal operation of the digital camera.

A wireless LAN 280 is a unit for establishing a network connection in order to perform wireless communications. This makes it possible to automatically save captured images on a network server to reduce the amount of space used in the external memory 270 as well as to post the captured images to social networking services or the like, for example.

The wireless LAN 280 also makes it possible to access manufacturer services or the like to update the digital camera operation programs saved on the flash memory 220 or to add or modify the information stored in the database 60 that represents the characteristics of various types of subjects.

The G sensor 290 detects movement of the digital camera and sends those detection results to the object extraction unit 50, thereby making it possible to change the read priority used when the object extraction unit 50 reads the data that represents the characteristics of the subject from the database 60. The G sensor 290 is an accelerometer inmost cases and can detect linear movement of the digital camera in the front, rear, left, and right directions as well as angular acceleration when the digital camera is panned and then can convert those movements of the digital camera into data.

Moreover, implementing not only the functionality of an accelerometer but also the functionality of a magnetic field sensor in the G sensor 290 makes it possible to do the following. When the digital camera is pointing upwards, for example, flying birds can be prioritized when the object extraction unit 50 searches the data that represents the characteristics of the subject and is read from the database 60. Similarly, when the digital camera is moved in an upward direction, objects that tend to move in an upward direction, such as a cat climbing a tree, can be prioritized when the object extraction unit 50 searches the database 60. This makes it possible to extract the characteristics of the subject more quickly, thereby making it possible to start tracking that subject more quickly.

<Imaging Areas of Main Camera and Sub-Camera>

Next, the capturing areas of the main camera and the sub-camera of the image pickup device according to Embodiment 1 of the present invention will be described with reference to FIGS. 4(A) to 4(C). FIGS. 4(A) to 4(C) are explanatory drawings for explaining the capturing areas of the main camera and the sub-camera of the image pickup device according to Embodiment 1 of the present invention and illustrate the positional relationships between the subject and the capturing areas of the main camera and the sub-camera.

A capturing area 310 of the sub-camera 80 has a wider angle than a capturing area 320 of the main camera 20 and therefore always captures a wider region. In other words, in FIGS. 4(A) to 4(C), the region that can be seen through the EVF 40 and that is actually captured is the capturing area 320 of the main camera 20, and the capturing area 310 of the sub-camera 80 is always capturing a wider region than the capturing area 320 of the main camera 20.

In FIG. 4(A), the subject 120 is within the capturing area 320 of the main camera 20. Here, the user has selected a flying bird as the subject 120 and is tracking the subject 120. The subject 120 is currently positioned substantially in the center of the field of view of the main camera 20 in a state that would be suitable for capturing an image, which makes it possible for the main camera 20 to track the subject 120.

FIG. 4(B) illustrates a state in which the subject 120 is about to leave the capturing area 320 of the main camera 20. Here, it is difficult to recognize and track the subject 120 using only main camera 20, and therefore the image feed from the sub-camera 80 is referenced as well to continue recognizing and tracking the subject 120.

If the lens of the main camera 20 is interchangeable or is a zoom lens, the optical system of the sub-camera 80 is required to be configured in a special way to ensure that the optical system of the sub-camera 80 always has a wider angle than the capturing area 320 of the main camera 20. In the present embodiment, the following approaches can be used, for example.

In a first approach, a lens that has an angle of view wider than the angle of view of the widest-angle lens of the lenses that can be used for the main camera 20 is used for the sub-camera. In this case, when the subject 120 is tracked while using the widest-angle lens for the main camera 20, the possibility of the subject leaving the frame of the main camera 20 is far smaller than when a telephoto lens is used, and therefore using a wide-angle lens whose focal length at the maximum angle of view is substantially the same or slightly greater than that of the lens used for the main camera 20 makes it possible to achieve sufficient functionality as the lens used for the sub-camera 80.

However, when a moving subject is attempted to be captured while a telephoto lens is used that has the longest focal length among the lenses that can be used for the main camera 20, the subject 120 can only be recognized in a very small region of the capturing area of the sub-camera 80. Therefore, a sensor that has a pixel count sufficient for recognizing the subject 120 even in this type of situation and a lens that has sufficient resolution are required to be used for the sub-camera 80.

In a second approach, given the relationship between the focal lengths of the lenses for the main camera 20 and the sub-camera 80 described in the first approach, under the assumption that the sub-camera 80 needs to be used when the focal length of the lens used for the main camera 20 that captures the subject 120 that needs to be tracked using the sub-camera 80 is greater than or equal to a certain value, for example, when the lens used for the main camera has an optical focal length of greater than or equal to approximately f=100 mm when converted to the focal length of a lens for a 35 mm film camera that captures images on a so-called "full-size" screen of approximately 36 mm×24 mm in size, such as in a lens used in a digital single-lens reflex camera or the like, the focal length of the lens for the sub-camera 80 is determined to a certain longer focal length instead of the focal length of the widest-angle lens, for example, the optical focal length of approximately f=50 mm when converted to the focal length of a lens for a 35 mm film camera.

However, even in this case, if the lens used for the main camera is an extremely powerful telephoto lens, such as a lens with an optical focal length of greater than or equal to f=500 mm when converted to the focal length of a lens for a 35 mm film camera, for example, the angle of view of the main camera 20 will only be 1/10 of the length of the sensor of sub-camera 80, and the subject 120 still needs to be recognized and tracked in this small region. Therefore, like in the first approach, a sensor that has a pixel count sufficient for recognizing the subject 120 and a lens that has sufficient resolution are needed to be used for the sub-camera 80.

In a third approach, the lens used for the sub-camera 80 can have a variable focal length. More specifically, when the lens for the main camera 20 is changed, the focal length of the new lens for the main camera 20 may be read via an electronic interface between the lens and the camera body. Moreover, when the lens for the main camera 20 is a zoom lens and the focal length is changed while that zoom lens is used, the new optical focal length of the lens may be read in a similar manner.

Furthermore, when a zoom lens is used as the lens for the sub-camera 80 and the focal length of the lens is set to a prescribed value so as to have equal angle of view, the focal length is changed to, for example, a value that is twice the optical focal length of the main camera 20.

Note that such a zoom lens does not necessarily need to be able to capture images at all focal lengths between the minimum focal length and the maximum focal length of the lens for the sub-camera 80. For example, a lens that has a configuration that exhibits sufficient optical performance at three focal lengths f=35 mm, 50 mm, and 75 mm when converted to the focal length of a lens for a 35 mm film camera may be used. Then, when the imaging lens for the main camera 20 is changed, the appropriate focal length from among those three focal lengths can be selected and used for the lens for the sub-camera 80.

Another possible approach is to change the lens for the sub-camera 80 when the imaging lens for the main camera 20 is changed.

As illustrated in FIG. 4(C), these approaches make it possible for the sub-camera 80 to continue tracking the subject 120 even when the angle of view of the capturing area 320 of the main camera 20 changes. Moreover, as illustrated in FIG. 2, there is a positional difference equal to the base length between the central optical axes of the main camera 20 and the sub-camera 80. Particularly at close distances, the positional relationship between the central optical axis of the main camera 20 and the subject will not match the positional relationship between the central optical axis of the sub-camera 80 and the subject. However, even in this case, the optical relationship between the positions of the subject 120, the main camera 20, and the sub-camera 80 can be determined by calculating the distance between the digital camera or the like and the subject 120. This makes it possible to correct for any error by an amount corresponding to the base length and continue to track the subject 120 using the sub-camera 80.

<Examples of Images Displayed in EVF>

Next, examples of images displayed in the EVF of the image pickup device according to Embodiment 1 of the present invention will be described with reference to FIGS. 5(A) to 5(D). FIGS. 5(A) to 5(D) are explanatory drawings for explaining examples of images displayed in the EVF of the image pickup device according to Embodiment 1 of the present invention.

Figure 5A:
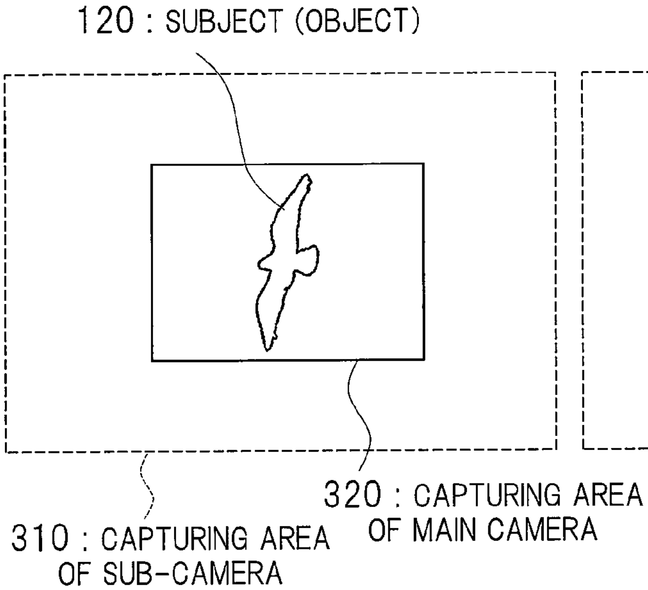

Similar to FIG. 4(A), in FIG. 5(A), the subject 120 is within the capturing area 320 of the main camera 20. Here, the user has selected a flying bird as the subject and is tracking the subject. The subject 120 is currently positioned substantially in the center of the field of view of the main camera 20 in a state that would be suitable for capturing an image. The user can verify this via the EVF 40, which makes it possible for the subject to be tracked using the main camera 20.

Figure 5B:
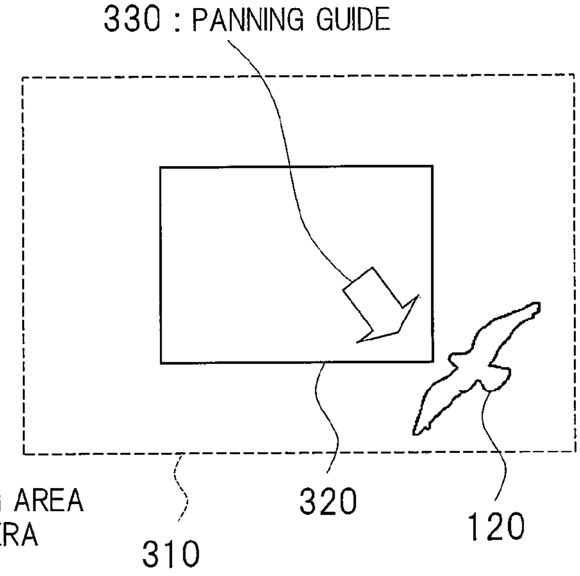

FIG. 5(B) illustrates a state in which the subject 120 has left the capturing area 320 of the main camera 20. Here, the main camera cannot track the subject 120, but the subject 120 is still captured in the capturing area 310 of the sub-camera 80 that captures images at a wider angle than the capturing area 320 of the main camera 20.

Therefore, in the present embodiment, a panning guide 330 is displayed in the EVF 40 so that the subject 120 that is currently only being captured by the sub-camera 80 and cannot be seen in the field of view of the main camera 20 can be brought back within the field of view of the main camera. Pointing the digital camera or the like in the direction indicated by the arrow of the panning guide 330 makes it possible for the user to recapture the subject 120 in the EVF 40.

Figure 5C:
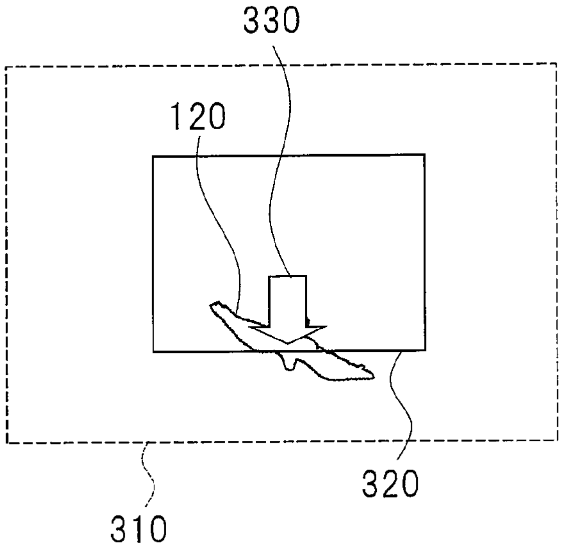

In FIG. 5(C), unlike in FIG. 5(B), the moving subject 120 is still currently within the field of view of the main camera 20 but is about to leave the field of view of the main camera 20. Here, displaying the panning guide 330 in the EVF 40 as an arrow guide that indicates the direction in which to point the digital camera or the like makes it possible to keep the subject within the field of view of the main camera 20.

This process is executed primarily for the image from the main camera 20. In the present embodiment, when the flying bird that is the subject 120 is moving towards bottom of the screen, a guide for tracking the subject is presented to the user in order to make it possible to continue tracking the subject 120.

Figure 5D:
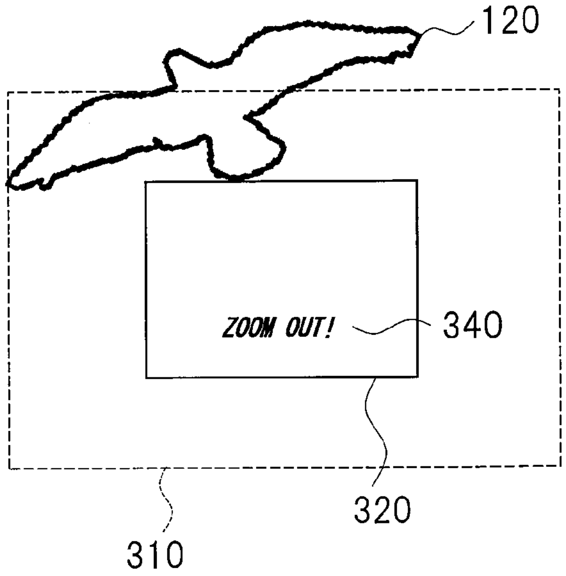

In FIG. 5(D), the subject 120 being captured by the main camera is rapidly approaching the camera and has become larger than the field of view of the main camera 20. Here, a “ZOOM OUT!” message 340 is displayed in the EVF 40 to alert the user that the focal length of the lens is currently too long.

More specifically, when this message is displayed, the user can adjust the zoom lens of the main camera 20 to make the focal length shorter and thereby bring the subject 120 back into the field of view of the main camera 20. Furthermore, in configurations in which the focal length of the zoom lens can be controlled by the system, the focal length of the zoom lens may be shortened automatically to assist the user in capturing images.

Meanwhile, when the subject 120 rapidly moves away from the digital camera or the like, a “ZOOM IN!” may be displayed or the zoom lens may be adjusted automatically.

The panning guides 330 and the “ZOOM OUT!” message 340 may be displayed simply as an on-screen display (OSD) in the EVF 40, or colors or flashing effects may be applied to provide greater emphasis.

In this case, the flashing speed may be set according to the relationship between the digital camera or the like and the subject 120, with the speed being faster when the required user operation for the digital camera or the like is more urgent. Moreover, providing settings for the digital camera or the like that can be configured in advance to determine how the guides are displayed and whether the guides are displayed at all makes it possible for the user to freely select whether to use the guides.

<Operation of Image Pickup Device>

Next, the operation of the image pickup device according to Embodiment 1 of the present invention will be described with reference to FIG. 6. FIG. 6 is a flowchart illustrating the operation of the image pickup device according to Embodiment 1 of the present invention and illustrates the overall operation of a digital camera.

First, once the power is turned on, all of the circuits are activated and the initial settings are configured. Here, the digital camera is booted and starts operating in accordance with the initial values specified in advance by the user such as those illustrated in FIG. 5(D), for example (step S100).

Next, the camera enters a loop. First, it is determined whether a power OFF instruction has been issued due to the user pressing a power OFF button or the like, for example (step S110). If it is determined in step S110 that a power OFF instruction has been issued, the digital camera is completely powered OFF (step S120). Otherwise, the loop continues to the following operations.

However, if the remaining charge of a battery (not illustrated in the figures) becomes less than or equal to a prescribed value, the camera is powered OFF automatically. In this case, a message such as "Battery depleted" may be displayed to the user in the EVF or on the LCD 130.

Next, a main camera imaging process is executed to get an image feed from the main camera 20 at 30 frames per second (30 fps), for example (step S130), and this image feed is then displayed in the EVF 40 (step S140). The user can then target and track the subject 120 by using the EVF 40 in which the 30 fps video feed is displayed as the view finder of the digital camera.

Next, it is determined whether the user has pressed the shutter button (step S150). If it is determined in step S150 that the shutter button has been pressed, the camera enters a state for getting an image from the main camera 20, and the subject 120 is brought into focus. At this time, the camera is switched from a mode in which not all of the pixels of the main camera are used while the main camera is being used as a finder to provide a high speed image feed to a mode for getting the data from all of the pixels of the main camera 20, for example, the data from all of the pixels is obtained (step S160), and then the obtained image data is compressed and saved (step S170).

In step S170, the data is compressed to a JPEG format, for example, and then the compressed image data is saved to a removable memory such as SD memory. Next, the captured image is displayed on the LCD 130 for a prescribed time (step S180) so that the user can verify the captured image. Then, the camera returns to step S110, and the basic overall loop for capturing images is repeated.

Furthermore, if it is determined in step S150 that the shutter button has not been pressed, the camera executes an object extraction process for identifying the subject 120 in the image feeds from the main camera 20 and the sub-camera 80 so that that moving subject can be tracked (step S190). In this object extraction process, characteristics such as the shapes and colors of expected subjects 120 are read from the database 60, and the correlation between these characteristics and the object in the image feeds from the main camera 20 and the sub-camera 80 is calculated in order to extract the actual subject.

Next, it is determined whether there is an object that needs to be tracked among the objects extracted as the subject 120 in step S190 (step S200). If it is determined in step S200 that there is no object that needs to be tracked among the extracted objects, the camera returns to step S110, and the basic overall loop for capturing images is repeated.

In the determination in step S200, the presence of an object that needs to be tracked is determined according to whether there is a subject that was specified as the object that the user wants to capture because that subject always remains in the capturing area or because the user has selected that subject 120 from among those displayed on the LCD 130, for example.

If it is determined in step S200 that there is an object that needs to be tracked among the extracted objects, it is determined whether the object to be tracked is present in the image from the sub-camera 80 (step S210). If it is determined in step S210 that the object to be tracked is present in the image from the sub-camera 80, for example, when the position of the subject 120 is about to leave the capturing area of the main camera 20 while that subject is being captured by the sub-camera 80, or when the subject is only being captured by the sub-camera 80, the panning guides 330 illustrated in FIGS. 5(B) and 5(C) are displayed in the EVF 40 in order to display the direction in which the subject 120 is present in the EVF 40 with arrows (step S220).

If it is determined in step S210 that the object to be tracked is not present in the image from the sub-camera 80, and once the arrows that indicate the direction in which the subject 120 is present have been displayed in the EVF 40 in step S220, the object is brought into focus (step S230) and then continues to be tracked. Then, the camera returns to step S110, and the basic overall loop for capturing images is repeated while waiting for the user to press the shutter button.

Even when the object that the user is filming as the subject 120 leaves the capturing area 320 of the main camera 20, the process described above makes it possible for the user to identify the direction in which the subject 120 is present, thereby making it possible to continue tracking the subject 120 while keeping that subject in focus.

<Method of Correcting for Sub-Camera Mounting Error>

Next, a method of correcting for mounting error in the sub-camera of the image pickup device according to Embodiment 1 of the present invention will be described with reference to FIG. 7. FIG. 7 is an explanatory drawing for explaining the method of correcting for mounting error in the sub-camera of the image pickup device according to Embodiment 1 of the present invention. Unlike the main camera 20, the sub-camera 80 is not a camera for actually capturing images, and therefore the sub-camera 80 does not necessarily need to have the level of performance that makes it possible to capture high resolution static images. It is preferable that a camera module of the type utilized in small mobile devices such as mobile phones and smartphones, which is a single package that includes both the camera body and the signal processing circuits, be used due to design requirements such as having a pixel count of greater than or equal to some prescribed value or having a small overall size.

The sub-camera 80 of the present embodiment needs to simultaneously recognize the subject projected on the main camera 20, and therefore it is preferable that the optical axes of the main camera 20 and the sub-camera 80 be parallel. However, when a camera module of the type used in mobile phones and smartphones is used, for example, it is difficult to align the optical axis accurately and precisely when the camera module is mounted.

Therefore, a method for correcting for mounting error in the sub-camera 80 when the main camera 20 and the sub-camera 80 are attached to the body of the digital camera will be described next.

As illustrated in FIG. 7, a subject 360 that is recognized as an infinitely distant image is simultaneously captured by the main camera 20 and the sub-camera 80 through a condenser lens 350. When the subject image 400 of the subject 360 is brought into the center of the image feed 380 from the main camera 20, the subject image 400 appears at an off-center position in the image feed 390 from the sub-camera 80 due to the error in mounting position precision in the sub-camera 80.

This off-center position can be numerically measured in X-Y coordinates from the left edge of the image. Then, these values are used to pass coordinate correction values to an image data processing circuit of the sub-camera 80 so that the subject image 400 in the image feed from the sub-camera 80 is brought to the center of the sub-camera 80. This makes it possible to recognize the subject image 400 in the center of the image feed 380 from the main camera 20 and the subject image 400 in the image feed from the sub-camera 80 as the same subject, thereby making it possible to correct for the mounting error in the sub-camera 80.

In the present embodiment, a digital camera was described as an example of the image pickup device. However, the present embodiment may be applied to any device in which an image of a subject is projected through a lens onto a camera sensor and then the amount of light incident on each pixel is measured in order to capture two-dimensional images, such as a video camera.

Embodiment 2

Embodiment 1 includes the sub-camera 80. Embodiment 2 makes it possible to continue tracking a subject even when the subject leaves the capturing area using only a main camera 20.

<Basic Configuration of Image Pickup Device>

Next, the basic configuration of an image pickup device according to Embodiment 2 of the present invention will be described with reference to FIG. 8. FIG. 8 is a block diagram illustrating the basic configuration of the image pickup device according to Embodiment 2 of the present invention.

As illustrated in FIG. 8, the present image pickup device has a configuration in which the sub-camera 80 and the subject tracking unit 90 for tracking the subject in the image feed from the sub-camera 80 have been removed from the image pickup device illustrated in FIG. 1. Here, the image pickup device includes the main camera 20 that is a camera sensor onto which an image of a subject is projected via an objective lens 10, a DSP 30, an EVF 40, an object extraction unit 50, a database 60, a spatial frequency calculator 70, a distance information calculator 100, and an AF controller 110.

Together, the DSP 30, the object extraction unit 50, the spatial frequency calculator 70, the distance information calculator 100, and the AF controller 110 form a processing unit.

Similar to Embodiment 1, the present image pickup device selects a moving object such as a bird that is flying at high speed as a subject that is the object to be captured. Also similar to Embodiment 1, this object is recognized as the subject when the light in the image of the subject passes through the objective lens 10 and is received by the main camera 20 for at least a prescribed period of time and continues to be received by the main camera 20 for that prescribed period of time.

Similar to Embodiment 1 as illustrated in FIG. 1, in the present embodiment, an image of the subject that is projected via the objective lens 10 onto the main camera 20 is converted to an electronic signal and input to the DSP 30. Here, the input signal is converted to a YUV signal that includes brightness and color difference signals and simultaneously presented to the user in the EVF 40 so that the user can pan the image pickup device to follow the subject, particularly when the subject is moving.

The operations of the object extraction unit 50, the database 60, the spatial frequency calculator 70, the distance information calculator 100, and the AF controller 110 for tracking the moving subject are the same as in Embodiment 1 as illustrated in FIG. 1.

<Subject-Tracking Operation of Image Pickup Device>

Next, the subject-tracking operation of the image pickup device according to Embodiment 2 of the present invention will be described with reference to FIGS. 9(A) to 10(B). FIGS. 9(A) to 10(B) are explanatory drawings for explaining the subject-tracking operation of the image pickup device according to Embodiment 2 of the present invention. FIGS. 9(A) and 9(B) illustrate a case in which the subject is captured using all of the pixels of the main camera, and FIGS. 10(A) and 10(B) illustrate a case in which the subject is captured using only some of the pixels of the main camera.

Unlike Embodiment 1, the present embodiment does not include a sub-camera 80. Therefore, the moving subject is tracked using only the information from the main camera 20. This can be done using either of the following two methods.

In a first method, the subject is captured using the all of the pixels of the main camera 20. As illustrated in FIG. 9(A), in this case, a subject 120 cannot be re-captured if that subject leaves a capturing area 410 of the main camera 20, for example. As a countermeasure, when the subject 120 leaves the capturing area 410 of the main camera 20, the focal length of a zoom lens is automatically shortened and then the image pickup device searches for and captures the subject 120 again using the wider-angle lens, thus setting the capturing area 410 to the state illustrated in FIG. 9(B), for example. This makes it possible to continue tracking the subject 120.

In a second method, rather than using all of the pixels of the main camera 20, a subset of pixels that does not include all of the pixels of the main camera 20 and forms a region of a prescribed size is used as the imaging pixels for the capturing area 410.

In this case, the capturing area 410 illustrated in FIG. 10(A) is the region displayed in the EVF 40, which is the region that the user sees when actually capturing images. However, an additional wider-angle region is allocated within the main camera 20 as a capturing area 310. In this way, even when the subject 120 leaves the region displayed in the EVF 40, the main camera 20 continues tracking the subject 120 and displays a panning guide 330 to indicate the position of the subject 120 to the user. This makes it possible to display an instruction to move the image pickup device so that the subject can continue to be tracked further.

Moreover, as illustrated in FIG. 10(B), when the subject 120 has only partially left the capturing area 410, the subset of all of the pixels of the main camera 20 that is allocated as the capturing area 410 is shifted away from the center of the main camera 20 towards the direction in which the subject 120 is present in order to re-allocate the subset of pixels for capturing the subject 120. This makes it possible to continue tracking and capturing the subject 120.

Next, the method of using a subset of pixels that does not include all of the pixels of the main camera 20 and forms a region of a prescribed size as the imaging pixels for the capturing area 410 will be described in more detail. The main camera 20 covers a wider-angle region than the capturing area 410 that is used for actually capturing images. Here, if the subject 120 is outside of the capturing area 410, the panning guide 330 is displayed in the EVF 40 in order to display an instruction to move the image pickup device to the user. In the example illustrated in FIG. 10(A), the subject 120 is in the lower right corner, and therefore an instruction to point the camera more towards the lower right direction is displayed.

Moreover, when the capturing area 410 itself is moved in the lower right direction to bring the subject 120 back into the capturing area 410, even if the subject 120 is successfully brought back into the capturing area 410, the capturing area 410 will be in an off-center position relative to all of the pixels of the main camera 20. Therefore, as illustrated in FIG. 10(B), the panning guide 330 continues to be displayed in the EVF 40 in order to continue indicating the direction in which the user should track the subject until the capturing area 410 is brought back into the approximate center of the main camera 20.

In the present embodiment, similar to Embodiment 1, even when the object that the user is filming as the subject 120 leaves the capturing area 410, the process described above makes it possible for the user to find the subject 120 again, thereby making it possible to continue tracking the subject 120 while keeping that subject in focus.

Embodiment 3

In Embodiments 1 and 2, the actual capturing area is displayed in the EVF 40. However, in Embodiment 3, when a subject 120 leaves a capturing area 410, the image displayed in an EVF 40 is switched according to the positional relationship between the subject 120 and the capturing area 410 in order to display a region outside of the capturing area 410 as a supplementary area. Other than the display process for the EVF 40, the operation of Embodiment 3 is the same as in Embodiments 1 and 2.

<Examples of Images Displayed in EVF>

Next, examples of images displayed in the EVF of the image pickup device according to Embodiment 3 of the present invention will be described with reference to FIGS. 11(A) and 11(B). FIGS. 11(A) and 11(B) are explanatory drawings for explaining examples of images displayed in the EVF of the image pickup device according to Embodiment 3 of the present invention.

In FIG. 11(A), the subject 120 in the capturing area 410 displayed in the EVF 40 is about to leave the main camera 20. Here, the image pickup device continues to capture the subject 120 either by using a sub-camera 80 or by using portion of the overall capturing area of a main camera 20 as the actual capturing area of the main camera 20 while the subject begins to move to a position that is not visible to the user.

Then, as illustrated in FIG. 11(B), the region visible to the user in the EVF 40 is switched to an image feed from the sub-camera 80 or to an image feed from the entire capturing area of the main camera 20 as a supplementary area 420, and a frame that indicates the capturing area 410 that will actually be captured is superimposed on the supplementary area 420. This allows the user to track the subject 120 in the wider supplementary area 420 and then satisfactorily frame the subject in the capturing area 410 and capture an image.

It is also possible to integrate the process of the image pickup device of Embodiment 2 that does not include the sub-camera 80 into the image pickup device of Embodiment 1 that does include the sub-camera 80. In this case, the capturing area of the sub-camera 80 may be set to a different region than the capturing area that includes all of the pixels of the main camera 20. Then, when the subject 120 leaves the actual capturing area, the optimal capturing area outside of the actual capturing area can be selected in order to make it possible to track the subject with higher precision.

REFERENCE SIGNS LIST

10 Objective lens
20 Main camera
30 DSP
40 EVF
50 Object extraction unit
60 Database
70 Spatial frequency calculator
80 Sub-camera
90 Subject tracking unit
100 Distance information calculator
110 AF controller

The invention claimed is:

1. An image pickup apparatus comprising:
a camera configured to capture an image of a scene including a subject and output an image signal based on the captured image;
an image processor configured to generate an image data from the image signal;
a display configured to display the image data;
a touch panel;
a processor configured to track and focus the subject when the subject is designated by a first touch operation to the touch panel; and
a storage configured to store the image data,
wherein the processor is configured to:
display a photographing frame on the display together with the image data, the photographing frame corresponding to a clipping area which is used by the image processor to pick up and generate a partial image data from the image data and is including an image of the designated subject;
change a position of the clipping area based on a tracking result of a movement of the designated subject;
change a display position of the photographing frame based on the changed position of the clipping area and display the photographing frame on the display; and
upon receiving a second touch operation via the touch panel, generate the partial image data and store the partial image data into the storage.

2. The image pickup apparatus according to claim 1, further comprising a distance detector configured to obtain information of a distance from the image pickup apparatus to the subject,
wherein the processor is further configured to change a zoom value based on the information of the distance obtained by the distance detector.

3. The image pickup apparatus according to claim 2,
wherein the processor is further configured to display, on the display, a message relating to the distance.

4. The image pickup apparatus according to claim 1, further comprising another camera having a focal distance, different from a focal distance of the camera, to capture the image of the scene,
wherein the processor is further configured to select the camera or the another camera based on the position of the clipping area.

5. The image pickup apparatus according to claim 1, wherein the image data generated by the image processor is still-image data or moving-image data.

6. The image pickup apparatus according to claim 1,
further comprising a wireless LAN circuitry,
wherein the processor is further configured to transmit the stored partial image data to an external server via the wireless LAN circuitry.

7. The image pickup apparatus according to claim 6,
wherein the processor is further configured to update programs stored in the storage by using the wireless LAN circuitry.

8. The image pickup apparatus according to claim 1,
wherein the processor is further configured to terminate tracking the designated subject upon receiving ether a third touch operation or the second touch operation via the touch panel.

9. The image pickup apparatus according to claim 1, wherein the processor is further configured to display information of sensor sensitivity, shutter speed, aperture value, or movement direction of the subject on the display.

10. The image pickup apparatus according to claim 1, wherein the processor is further configured to encrypt the partial image data based on a key information and store the encrypted partial image data into the storage.

11. A method comprising:

capturing, using a camera of an image pickup apparatus, an image of a scene including a subject;

outputting an image signal based on the captured image;

generating, using an image processor, image data from the image signal;

displaying the image data on a display;

tracking and focusing on the subject when the subject is designated by a first touch operation on a touch panel;

storing, in a storage, the image data;

displaying a photographing frame on the display together with the image data, the photographing frame corresponding to a clipping area which is used to pick up and generate a partial image data from the image data and is including an image of the designated subject;

changing a position of the clipping area based on a tracking result of a movement of the designated subject;

changing a display position of the photographing frame based on the changed position of the clipping area and displaying the photographing frame on the display; and upon receiving a second touch operation via the touch panel, generating the partial image data and storing the partial image data into the storage.

12. The method according to claim 11, further comprising:

obtaining, using a distance detector, information of a distance from the image pickup apparatus to the subject; and changing a zoom value based on the information of the distance obtained by the distance detector.

13. The method according to claim 12, further comprising displaying a message relating to the distance on the display.

14. The method according to claim 13, further comprising:

capturing, using another camera having a focal distance different from a focal distance of the camera, the image of the scene; and selecting the camera or the another camera based on the position of the clipping area.

15. The method according to claim 11, wherein the image data generated by the image processor is still-image data or moving-image data.

16. The method according to claim 11, further comprising transmitting the stored partial image data to an external server via a wireless LAN circuitry.

17. The method according to claim 16, further comprising updating programs stored in the storage by using the wireless LAN circuitry.

18. The method according to claim 11, further comprising terminating tracking the designated subject upon receiving ether a third touch operation or the second touch operation via the touch panel.

19. The method according to claim 11, further comprising displaying information of sensor sensitivity, shutter speed, aperture value, or movement direction of the subject on the display.

20. The method according to claim 11, further comprising encrypting the partial image data based on a key information and store the encrypted partial image data into the storage.

* * * * *